US007449782B2

(12) United States Patent
Cabral, Jr. et al.

(10) Patent No.: US 7,449,782 B2
(45) Date of Patent: Nov. 11, 2008

(54) SELF-ALIGNED METAL TO FORM CONTACTS TO GE CONTAINING SUBSTRATES AND STRUCTURE FORMED THEREBY

(75) Inventors: Cyril Cabral, Jr., Ossining, NY (US); Roy A. Carruthers, Stormville, NY (US); Christophe Detavernier, Denderleeuw (BE); Simon Gaudet, Montreal (CA); Christian Lavoie, Ossining, NY (US); Huiling Shang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 10/838,378

(22) Filed: May 4, 2004

(65) Prior Publication Data

US 2005/0250301 A1 Nov. 10, 2005

(51) Int. Cl.
*H01L 29/40* (2006.01)

(52) U.S. Cl. ....................... 257/768; 257/741; 257/769; 257/E23.157

(58) Field of Classification Search ................. 257/616, 257/741, 768, 757, 769, E23.157

See application file for complete search history.

(56) References Cited

U.S. PATENT DOCUMENTS 6,331,486 B1 * 12/2001 Cabral et al. ................ 438/682
7,119,417 B2 * 10/2006 Sorada et al. ............... 257/616
2003/0109121 A1 * 6/2003 Rotondaro .................. 438/592
2003/0234439 A1 * 12/2003 Currie et al. ................ 257/616
2005/0006711 A1 * 1/2005 Rotondaro et al. .......... 257/407

* cited by examiner

*Primary Examiner*—Bradley K Smith
(74) *Attorney, Agent, or Firm*—Scully, Scott, Murphy & Presser, P.C.; Robert M. Trepp, Esq.

(57) ABSTRACT

A method for forming germano-silicide contacts atop a Ge-containing layer that is more resistant to etching than are conventional silicide contacts that are formed from a pure metal is provided. The method of the present invention includes first providing a structure which comprises a plurality of gate regions located atop a Ge-containing substrate having source/drain regions therein. After this step of the present invention, a Si-containing metal layer is formed atop the said Ge-containing substrate. In areas that are exposed, the Ge-containing substrate is in contact with the Si-containing metal layer. Annealing is then performed to form a germano-silicide compound in the regions in which the Si-containing metal layer and the Ge-containing substrate are in contact; and thereafter, any unreacted Si-containing metal layer is removed from the structure using a selective etch process. In some embodiments, an additional annealing step can follow the removal step. The method of the present invention provides a structure having a germano-silicide contact layer atop a Ge-containing substrate, wherein the germano-silicide contact layer contains more Si than the underlying Ge-containing substrate.

10 Claims, 1 Drawing Sheet

10
18
24
22
24
20
28
26
16
16
14
12
14

18
24
22
24
30
20
30
28
26
26
16
16
14
12
14

18
24
22
24
30
20
30
16
16
14
12
14

18
24
22
24
32
20
32
16
16
14
12
14

SELF-ALIGNED METAL TO FORM CONTACTS TO GE CONTAINING SUBSTRATES AND STRUCTURE FORMED THEREBY

FIELD OF THE INVENTION

The present invention relates to semiconductor devices and more particularly to a semiconductor device that has a self-aligned germano-silicide contact of high etch resistance located atop a Ge-containing layer. The present invention also relates to a method of fabricating the self-aligned germano-silicide contact atop the Ge-containing layer.

BACKGROUND OF THE INVENTION

Current complementary metal oxide semiconductor (CMOS) technology uses silicides as contacts to source/drain (S/D) regions of devices that are fabricated upon a Si-containing substrate. Examples of silicides with low resistivity and contact resistance that are currently being used are the C54 phase of $TiSi_2$, $CoSi_2$, and NiSi. All three of these silicides are integrated using a self-aligned silicide process (i.e., a salicide process). This process consists of a blanket deposition of the metal (Ti, Co, or Ni) with a cap layer (such as TiN, Ti or W), annealing at a first lower temperature to form a first silicide phase (i.e., the C49 phase of TiSi, CoSi, or NiSi), selectively wet etching the cap layer and unreacted metal that is not in contact with silicon, and annealing at a second higher temperature to form the low resistance metal silicide phase (the C54 phase of $TiSi_2$ or $CoSi_2$). For the low resistance NiSi, the second anneal is typically not needed.

An additional approach for the Ni silicide is to form a metal rich Ni silicide during the first anneal followed by the formation of NiSi during the second anneal. One advantage of these particular suicides is that they all may be implemented with the self-aligned process avoiding additional lithographic steps.

In recent years, there has been a desire in the semiconductor industry to use different substrates besides Si-containing substrates in an attempt to improve the device performance by providing substrates that have increased electron/hole mobilities. One such substrate is a Ge-containing substrate.

One problem associated with Ge-containing substrates is that it is difficult to form contacts to Ge-containing substrates because germanium oxide is soluble in water. For example, a Ge wafer will be etched in a simple peroxide solution as the peroxide can both oxidize the germanium and dissolve the oxide. As a result, any metal-germanium or metal-silicon-germanium contact formed on a Ge substrate is more subject to being attacked by etching solutions. Thus, because the Ge concentration in the substrate is rising, the industry needs to modify the etching solutions to the new material. In general, solutions are much less aggressive and the percentage of water in them is reduced. The disadvantage to modifying etching solutions is that there is a fair amount of development needed in order to have the modification become incorporated into standard CMOS processing. Moreover, modified etch solutions equate to alterations in the present processing tools and recipes.

In view of the above, there is a need for providing an alternative technique for forming a germano-silicide contact directly atop a Ge-containing substrate that avoids the need to modify the current etching solutions, tools and recipes employed in the semiconductor industry.

SUMMARY OF THE INVENTION

The present invention provides a method for forming germano-silicide contacts atop a Ge-containing layer that are more resistant to etching than conventional silicide contacts that are formed from a pure metal. In the present invention, a modification to the starting metal is used to make the germano-silicide contact. In particular, Si is added to the metal film, which provides a phase of germano-silicide that is more resistant to standard etching.

In broad terms, the method of the present invention includes first providing a structure that includes a plurality of gate regions located atop a Ge-containing substrate. After this step of the present invention, a Si-containing metal layer is formed atop the Ge-containing substrate. In some areas of the structure, the Ge-containing substrate is in contact with the Si-containing metal layer. Annealing is then performed to form a germano-silicide compound in regions in which the Si-containing metal layer and the Ge-containing substrate are in contact; and thereafter, any unreacted Si-containing metal layer is removed from the structure using a selective etch process. In some embodiments, an additional annealing step may follow the removal step.

The method of the present invention provides a structure having a germano-silicide contact layer atop a Ge-containing substrate, wherein the germano-silicide contact layer contains more Si than the underlying Ge-containing substrate. The germano-silicide contact layer of the present invention is a metal germano-silicide that is more resistant to etching than is a metal germanide that is formed from a pure metal, such as Ni. Increasing the amount of Si present in a germano-silicide layer increases its resistance to etching by standard etching solutions currently used in the salicide process.

DETAILED DESCRIPTION OF THE INVENTION

Figure 1:
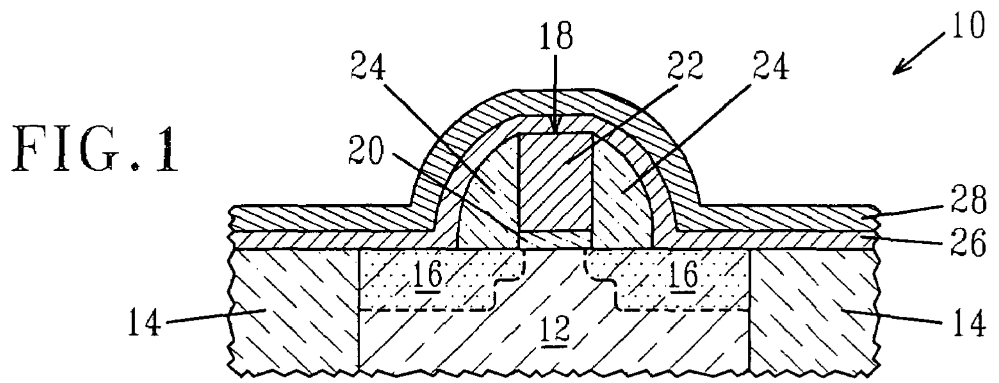
FIG. 1 is a pictorial representation (through a cross sectional view) illustrating an initial structure that is employed in the present invention in which a Si-containing metal layer is formed atop a structure including a Ge-containing substrate.

The present invention, which provides a self-aligned method to form germano-silicide contacts on a Ge-containing substrate and a structure formed by the self-aligned method, will now be described in greater detail by referring to the drawings that accompany the present application.

It should be noted that although the drawings and description that follow are specific for forming the germano-silicide contact to a Ge-containing substrate having CMOS devices, i.e., transistors, the method of the present invention can be useful for fabricating other types of semiconductor structures, such as electro-optic devices, in which a contact is needed to be formed to a Ge-containing substrate. It should also be noted that in the drawings that follow more than one CMOS device, i.e., transistor, can be formed atop the Ge-containing substrate. Also, if the gate electrode is polysilicon or SiGe and there is no hardmask located thereon, a contact, in accordance with the present invention, could be formed atop the SiGe gate electrode.

FIG. 1 shows an initial structure 10 that can be employed in the present invention. Specifically, the initial structure 10 shown in FIG. 1 comprises a Ge-containing substrate 12 having isolation regions 14 and source/drain diffusion regions 16 formed therein. The initial structure 10 of the present invention also includes a least one gate region 18 that includes a gate dielectric 20 and a gate conductor 22, located on top of the Ge-containing substrate 12. An optional hardmask, not shown, can be located atop the gate conductor 22. In the embodiment shown, the gate region 18 also includes at least one spacer 24 located on each sidewall thereof.

The initial structure 10 also includes a Si-containing metal layer 26 and an optional cap layer 28. As shown, the Si-containing metal layer 26 is formed first and then, if used, the optional cap layer 28 is formed. The Si-containing metal layer 26 is in contact with exposed portions of the Ge-containing substrate 12, particularly, the Si-containing metal layer 26 is contact with the exposed Ge-containing substrate 12 at the source/drain diffusion regions 16.

The Ge-containing substrate 12 of the initial structure 10 shown in FIG. 1 comprises any germanium-containing semiconducting material including, but not limited to: a pure Ge layer, i.e., a Ge wafer; or Ge-on-insulator, SiGe, SiGeC, Si on a SiGe layer, SiGe on a Si layer, a Ge layer on Si or Si on Ge. The Ge-containing substrate 12 typically contains at least 50 atomic % Ge, with a Ge content of greater than 80 atomic % being even more typical. The Ge-containing semiconductor substrate 12 may be doped, undoped or contain doped and undoped regions therein.

In some embodiments, the Ge-containing substrate 12 is a structure in which a SiGe layer covers the raised source/drain (RSD) and the gate of a transistor. In yet other embodiments, the Ge-containing substrate 12 is an embedded SiGe structure.

The isolation regions 14 are typically formed first into the Ge-containing substrate 12. The isolation regions 14 can be trench isolation regions. The trench isolation regions are formed utilizing a conventional trench isolation process well known to those skilled in the art. For example, lithography, etching and filling of the trench with a trench dielectric may be used in forming the trench isolation regions. Optionally, a liner may be formed in the trench prior to trench fill, a densification step may be performed after the trench fill and a planarization process may follow the trench fill as well.

After forming the isolation regions 14 within the Ge-containing substrate 12, gate dielectric 20 is formed on the entire surface of the Ge-containing substrate 12 including atop the isolation regions 14, if it is a deposited dielectric. The gate dielectric 20 can be formed by a thermal growing process such as, for example, oxidation, nitridation or oxynitridation. Alternatively, the gate dielectric 20 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 20 may also be formed utilizing any combination of the above processes.

The gate dielectric 20 is comprised of an insulating material including, but not limited to: an oxide, nitride, oxynitride and/or silicate. In one embodiment, it is preferred that the gate dielectric 20 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof,including the addition of silicon and nitrogen.

The physical thickness of the gate dielectric 20 may vary, but typically, the gate dielectric 20 has a thickness from about 0.5 to about 10 nm, with a thickness from about 0.5 to about 3 nm being more typical.

After forming the gate dielectric 20, a blanket layer of a gate electrode material 22 is formed on the gate dielectric 20 utilizing a known deposition process such as physical vapor deposition (PVD), CVD or evaporation. The gate electrode material 22 may comprise polysilicon, SiGe, a silicide, a metal or a metal-silicon-nitride such as Ta—Si—N. Preferably, for substrates with a very high concentration of Ge (a Ge content on the order of about 25% or greater) the gate electrode 22 is comprised of a metal. Examples of metals that can be used as the gate electrode 22 include, but are not limited to: Al, W, Cu, Ti or other like conductive metals. The blanket layer of gate electrode material 22 may be doped or undoped. If doped, an in-situ doping deposition process may be employed. Alternatively, a doped gate electrode 22 can be formed by deposition, ion implantation and annealing.

The doping of the gate electrode 22 will shift the workfunction of the gate formed. Illustrative examples of doping ions include As, P, B, Sb, Bi, In, Al, Tl, Ga or mixtures thereof. The thickness, i.e., height, of the gate electrode material 22 deposited at this point of the present invention may vary depending on the deposition process employed. Typically, the gate electrode material 22 has a vertical thickness from about 20 to about 180 nm, with a thickness from about 40 to about 150 nm being more typical.

In some embodiments, an optional hardmask (not shown) may be formed atop the gate electrode material 22 by utilizing a conventional deposition process. The optional hardmask can be comprised of a dielectric such as an oxide or nitride.

The blanket gate electrode material 22 (and optionally the gate dielectric 20) is then typically, but not always, patterned by lithography and etching so as to provide at least one gate region 18. Each gate region 18 formed may have the same dimension, i.e., length, or they can have variable dimensions to improve device performance. The lithography step includes applying a photoresist to the upper surface of the blanket deposited gate electrode material 22, exposing the photoresist to a desired pattern of radiation and developing the exposed photoresist utilizing a conventional resist developer. The pattern in the photoresist is then transferred to the blanket layer of gate electrode material 22 utilizing a dry etching process. The patterned photoresist is removed after etching has been completed. In some embodiments, a hardmask may be formed prior to formation of the photoresist and used in patterning the blanket layer of gate electrode material 22.

Suitable dry etching processes that can be used in the present invention in forming the gate region 18 include, but are not limited to: reactive ion etching, ion beam etching, plasma etching or laser ablation. The dry etching process employed is typically selective to the underlying gate dielectric 20 therefore this etching step does not typically remove the gate dielectric 20. In some embodiments, this etching step may however be used to remove portions of the gate dielectric 20 that are not protected by the gate region 18. The latter embodiment is depicted in the drawings of the present application.

Next, at least one spacer 24 is formed on exposed sidewalls of each gate region 18. The at least one spacer 24 is comprised of an insulator such as an oxide, nitride, oxynitride and/or any combination thereof. The at least one spacer 24 is formed by deposition and etching.

In addition to the one spacer 24, the present invention also contemplates a structure including multiple spacers. In particular, the present invention contemplates a structure including a first spacer having a first width and a second spacer having a second width wherein the first width is narrower than the second width.

The width of the spacer must be sufficiently wide enough such that the source/drain silicide contacts (to be subsequently formed) do not encroach underneath the edges of the gate electrode 22 into the channel region of the transistor. Typically, the source/drain silicide contacts do not encroach underneath the edges of the gate stack when the spacer has a width, as measured at the bottom, from about 20 to about 80 nm.

After spacer formation, source/drain diffusion regions 16 are formed into the substrate. Note that the source/drain diffusion regions 16 include extension regions that are typically formed prior to spacer formation. The extensions are formed by ion implantation and annealing. The annealing step may be omitted and performed during activation, i.e., annealing, of the source/drain diffusion regions 16. By combining both activations in a single anneal, the thermal budget of the overall process can be lowered. The source/drain diffusion regions 16 are formed utilizing ion implantation and an annealing step. The annealing step serves to activate the dopants that were implanted by the previous implant step(s). The conditions for the ion implantation and annealing are well known to those skilled in the art.

Next, and if not previously removed, the exposed portion of the gate dielectric 20 is removed utilizing a chemical etching process that selectively removes the gate dielectric 20. This etching step stops on an upper surface of the Ge-containing substrate 12 as well as an upper surface of the isolation regions 14. Although any chemical etchant may be used in removing the exposed portions of the gate dielectric 20, in one embodiment dilute hydrofluoric acid (DHF) is used.

The above processing steps describe one technique that can be employed in the present invention for forming gate region 18. Another technique that can be employed is a damascene process in which a dummy gate region is first formed on the structure. After dummy gate formation, a planarizing dielectric material such as, for example, an oxide, is deposited and thereafter the structure is planarized to expose an upper surface of the dummy gate region. The dummy gate region is then selectively removed and gate region 18 is formed in the opening in which the dummy gate region was previously located. After formation of the gate region 18, the planarizing dielectric is etched back utilizing a conventional etching process.

It is emphasized that the Ge-containing substrate 12 could be local to the source/drain and gates as build by an embedded SiGe process or by a RSD process.

After forming the source/drain diffusion regions 16, a Si-containing metal layer 26 is formed atop the entire structure including isolation regions 14, source/drain diffusion regions 16 and the gate region 18. The term "Si-containing metal layer" is used in the present invention to denote at least one silicide metal that includes Si. In other terms, the Si-containing metal layer 26 employed in the present invention is a silicide metal alloy in which Si is present. Typically, the Si-containing metal layer 26 contains from about 0.1 to about 25 atomic % Si, with a Si content from about 10 to about 20 atomic % being more typical. In addition to Si, layer 26 also includes a silicide metal including, but not limited to: Ti, Ta, W, Co, Ni, Pt, Pd and alloys thereof. In one embodiment, Ni or Pt is preferred.

The presence of Si in the metal silicide layer offers the following advantages that cannot be obtained if a pure metal silicide layer is used: 1) for the equivalent silicide phase, some of the Ge will be replaced by Si which will make the silicide phase more resistant to etching; 2) the presence of Si in the metal silicide layer lowers the temperature at which a metal rich phase is formed. This allows the self-aligned process to be performed in a germano-silicide phase that is more rich in metal and therefore minimizes further the content of Ge in the layer that is needed to withstand the selective etch.

The Si-containing metal layer 26 may be deposited using a deposition process including, for example, chemical vapor deposition, physical vapor deposition, atomic layer deposition, electrodeposition and electroless deposition. In addition to the above deposition techniques, the Si-containing metal layer 26 can also be formed by first depositing a silicide metal layer and then ion implanting Si into the silicide metal layer. The Si ion implantation is performed under conditions that are capable of providing the aforementioned amount of Si into the Si-containing metal layer 26. Typically, a Si dose from about 5E15 to about 2E16 atoms/$cm^{-2}$ can be used.

The Si-containing metal layer 26 may also contain, in addition to Si and the silicide metal, at least one alloying additive. The presence of the at least one alloying additive in the Si-containing metal layer 26 can enhance the formation of a metal silicide. Examples of alloying additives that may be employed in the present invention include: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the metal within the Si-containing metal layer 26. When present, the alloying additive is present in an amount from about 0.1 to about 30 atomic percent. The alloying additive can be present in the initial deposited layer or it can be added to the layer via ion implantation at a time after metal deposition.

The Si-containing metal layer 26 has a sufficient thickness that will allow for silicide contacts to be subsequently formed. Typically, the Si-containing metal layer 26 has a thickness from about 2 to about 30 nm, with a thickness from about 5 to about 15 nm being more typical.

FIG. 1 also shows the presence of an optional cap 28 which is formed atop the Si-containing metal layer 26. When present, the optional cap 28 is composed of a diffusion barrier material such as, for example, TiN, Ti, W and WN. The optional cap 28 is formed by a conventional deposition process, including, for example, sputtering, evaporation, chemical vapor deposition, chemical solution deposition and the like.

If used, the optional cap 28 has a thickness after deposition that is typically from about 5 to about 40 nm, with a thickness from about 5 to about 20 nm being more typical.

The structure shown in FIG. 1 is then subjected to a salicide annealing process in which a germano-silicide contact is formed atop at least the source/drain diffusion regions 16. Note if the gate electrode material 22 is SiGe or polysilicon that does not include a hardmask, a germano-silicide contact can be formed atop the gate electrode material 22 as well. In accordance with the present invention, the germano-silicide contact is a silicide metal containing region that includes more Si than the underlying Ge-containing substrate. Typically, the amount of Si in the germano-silicide contact is the same or slightly below the initial content used in forming the Si-containing metal layer 26.

As indicated above, the germano-silicide contact is formed utilizing a silicide annealing process that includes at least a first anneal and removal of any unreacted Si-containing metal layer. An optional second annealing, which follows the removal step may be required in some instances if the first annealing step does not form a phase of the metal germano-silicide layer having its lowest resistance.

For instance, when the Si-containing metal layer 26 is comprised of Ni and Si and the substrate is pure Ge, two anneals are preferably employed since the first anneal, which provides a Ni rich phase, leads to a phase that is the most poorest in Ge. Hence, the Ni rich phase formed by the first anneal is the most etch resistant phase when conventional salicide etching solutions are employed. A second anneal is required in this instance.

Figure 2:
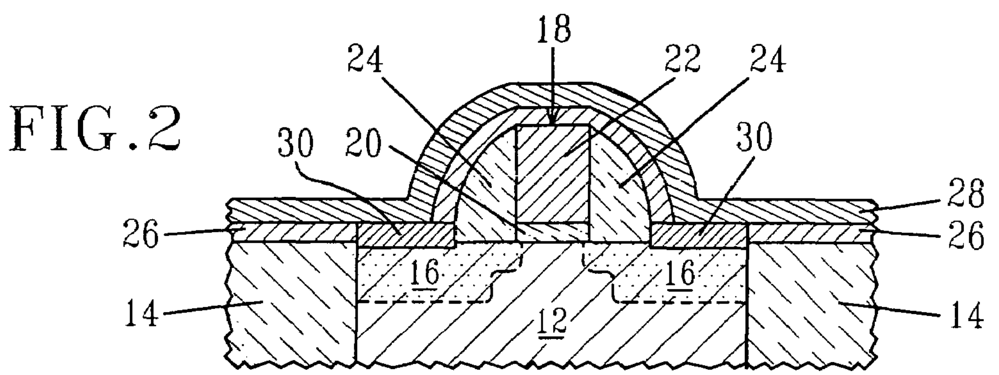
FIG. 2 is a pictorial representation (through a cross sectional view) illustrating the structure of FIG. 1 after performing a first anneal.

The first anneal is typically performed at lower temperatures than the optional second annealing step. Typically, the first annealing step is performed at a temperature from about 200° C. to about 700° C. using a continuous heating regime or various ramp and soak heating cycles. More preferably, the first annealing step is performed at a temperature from about 250° C. to about 550° C. Typical annealing times for the first anneal are from about 1 to about 120 seconds. Longer anneal times, as high as about 1 hour, are also contemplated herein for the lower temperatures. The first annealing step may form the lowest resistance phase of the germano-silicide contact or it can form a metal rich germano-silicide or other higher resistance phase metal germano-silicide. FIG. 2 shows such an embodiment in which the first anneal forms a metal rich germano-silicide or other higher resistance phase metal germano-silicide. The latter two materials are typically more etch resistant than the most conductive phase of the metal germano-silicide because they contain more Si. Reference numeral 30 is used to denote this more etch resistant material.

Figure 4:
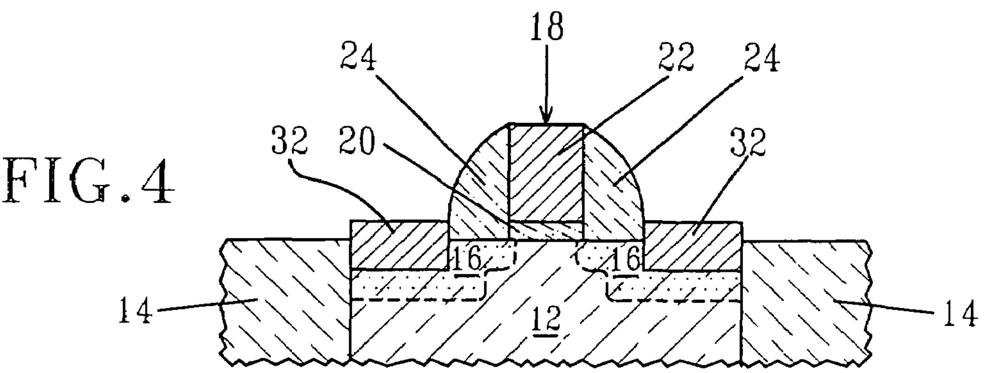
FIG. 4 is a pictorial representation (through a cross sectional view) illustrating the structure of FIG. 3 after performing an optional second anneal.

When needed, the second annealing step is performed at a temperature from about 250° C. to about 900° C. using a continuous heating regime or various ramp and soak heating cycles. More preferably, the second annealing step is performed at a temperature from about 350° C. to about 750° C. Typical annealing times for the second anneal are from about 1 to about 120 seconds. Longer anneal times, as high as 2 hours, are also contemplated herein since the second anneal can be considered as being the thermal budget of the back end of the line. The second anneal typically converts the high resistance metal germano- or metal rich silicide phase into a germano-silicide contact 32 of lower resistance. See FIG. 4. Note that the lower germano-silicide contact 32 can be formed using only one annealing step. In that case, it is formed in FIG. 2.

The salicide anneals are carried out in a gas atmosphere, e.g., He, Ar, $N_2$ or forming gas. The source/drain silicide contact annealing steps may use different atmospheres or the annealing steps may be carried out in the same atmosphere. For example, He may be used in both annealing steps, or He can be used in the first annealing step and a forming gas may be used in the second annealing step.

Figure 3:
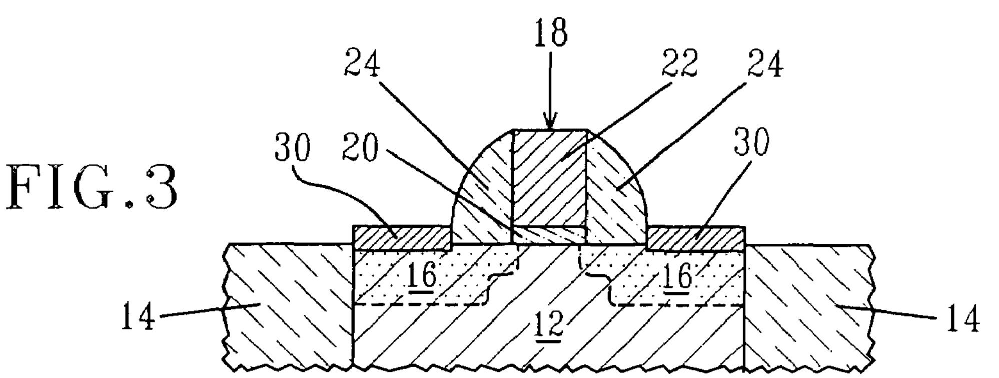
FIG. 3 is a pictorial representation (through a cross sectional view) illustrating the structure of FIG. 2 after removing any unreacted Si-containing metal layer that was not silicided during the first anneal.

The selective etching step includes any conventional etching process that can selectively remove non-reacted Si-containing metal. Note that this etch also removes the optional cap 28. Examples include wet etching using a sulfuric acid/hydrogen peroxide solution. Note that when wet etching a Si-containing metal, the metal is removed and the silicon is oxidized, and left therein as a $SiO_2$ protective layer. See FIG. 3. Note that although FIG. 3 depicts the presence of a higher resistance or metal rich germano-silicide layer, i.e, layer 30, the structure shown therein could contain the lowest resistance phase of the metal germano-silicide contact 32.

After performing the above steps, further CMOS processing steps for forming an interlevel dielectric containing conductively filled contact openings, which are in contact with the germano-silicide contacts 32 of the present invention, can be performed.

The method of the present invention provides a metal germano-silicide contact that is more resistant to etching than a typical metal silicide contact. Hence, the etching recipes and methodologies currently being employed can be used. If pure metal silicide film such as Ni was used instead of the Si-containing metal layer, low resistance NiGe would be formed that would be significantly removed in less than 2 minutes in usual etchants for standard Si processing at usual etching temperatures, both are well known to those skilled in the art.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A structure comprising:

a germano-silicide contact layer located directly on a Ge-containing substrate, wherein the germano-silicide contact layer comprises a metal germano-silicide having more Si than the Ge-containing substrate, wherein said germano-silicide contact layer does not abut a semiconductor layer consisting substantially of silicon.

2. The structure of claim 1 wherein the germano-silicide contact layer comprises a low resistivity phase of said metal germano-silicide.

3. The structure of claim 1 wherein the metal germano-silicide includes Ni or Pt.

4. The structure of claim 1 wherein the germano-silicide contact layer is located atop source/drain diffusion regions located in said Ge-containing substrate.

5. The structure of claim 1 further comprises at least one gate region on said Ge-containing substrate, wherein said germano-silicide contact layer borders said at least one gate region in a self-aligned manner.

6. The structure of claim 1 wherein the metal germano-silicide further includes at least one alloying additive.

7. The structure of claim 6 wherein the at least one alloying additive is selected from the group consisting of C, Al, Ti, V, Cr, Mn, Fe, Co, Ni, Cu, Ge, Zr, Nb, Mo, Ru, Rh, Pd, Ag, In, Sn, Hf, Ta, Re, Pt and combinations thereof.

8. The structure of claim 7 wherein the metal germano-silicide comprises Ni or Pt.

9. The structure of claim 1 wherein said Ge-containing substrate is a pure Ge layer and said germano-silicide contacts include a Ni alloy, a Pt alloy or a combination thereof.

10. A structure comprising:

a silicide contact layer atop a Ge-containing substrate, wherein the silicide contact layer contains more Si than the Ge-containing substrate and is composed of a metal germano-silicide that is more etch resistant than a metal silicide of the same phase, wherein said germano-silicide contact layer does not abut a semiconductor layer consisting substantially of silicon.

* * * * *